United States Patent [19]
Robinson et al.

[11] Patent Number: 5,952,719
[45] Date of Patent: Sep. 14, 1999

[54] METAL BALL GRID ELECTRONIC PACKAGE HAVING IMPROVED SOLDER JOINT

[75] Inventors: Peter W. Robinson, Bradford; Deepak Mahulikar, Madison, both of Conn.; Paul R. Hoffman, Modesto, Calif.

[73] Assignee: Advanced Interconnect Technologies, Inc., Manteca, Calif.

[21] Appl. No.: 08/891,446

[22] Filed: Jul. 10, 1997

Related U.S. Application Data

[62] Division of application No. 08/502,662, Jul. 14, 1995, abandoned.

[51] Int. Cl.⁶ .................................................. H01L 23/48
[52] U.S. Cl. .......................... 257/737; 257/738; 257/778; 257/713
[58] Field of Search ................................. 257/737, 738, 257/778, 713

[56] References Cited

U.S. PATENT DOCUMENTS

| | | |
|---|---|---|
| 3,248,681 | 4/1966 | Reintgen . |
| 3,351,700 | 11/1967 | Savolainen et al. . |
| 3,399,332 | 8/1968 | Savolainen . |
| 4,283,464 | 8/1981 | Hascoe . |
| 4,491,622 | 1/1985 | Butt . |
| 4,500,605 | 2/1985 | Fister et al. . |
| 4,577,056 | 3/1986 | Butt . |
| 4,581,680 | 4/1986 | Garner . |
| 4,712,127 | 12/1987 | Colombo et al. . |
| 4,784,974 | 11/1988 | Butt . |
| 4,811,166 | 3/1989 | Alvarez et al. . |
| 4,872,047 | 10/1989 | Fister et al. . |
| 4,888,449 | 12/1989 | Crane et al. . |
| 4,939,316 | 7/1990 | Mahulikar et al. . |
| 4,961,105 | 10/1990 | Yamamoto . |
| 5,001,546 | 3/1991 | Butt . |
| 5,015,803 | 5/1991 | Mahulikar et al. . |
| 5,044,074 | 9/1991 | Hadwiger et al. . |
| 5,073,840 | 12/1991 | Coors . |
| 5,103,292 | 4/1992 | Mahulikar . |
| 5,213,638 | 5/1993 | Mahulikar et al. . |
| 5,239,131 | 8/1993 | Hoffman et al. . |
| 5,241,133 | 8/1993 | Mullen, III et al. . |
| 5,315,155 | 5/1994 | O'Donnelly et al. . |
| 5,409,865 | 4/1995 | Karnezos .................................. 257/738 |
| 5,506,446 | 4/1996 | Hoffman et al. . |
| 5,578,869 | 11/1996 | Hoffman et al. . |
| 5,629,835 | 5/1997 | Mahulikar et al. . |

FOREIGN PATENT DOCUMENTS

| | | |
|---|---|---|
| 63-102326 | 5/1988 | Japan . |
| 63-252457 | 10/1988 | Japan . |
| WO 92/06495 | 4/1992 | WIPO . |

OTHER PUBLICATIONS

Darveaux et al. "Reliability of Plastic Ball Grid Assembly" appearing in *Ball Grid Array Technology* edited by John H. Lau, Chapter 13, pp. 13.1–442. McGraw-Hill, Inc. (1995).

*Primary Examiner*—Peter Toby Brown
*Assistant Examiner*—Roy Potter
*Attorney, Agent, or Firm*—Gregory S. Rosenblatt; Wiggin & Dana

[57] ABSTRACT

The bending of a ball grid array electronic package having a metallic base is reduced minimizing stresses applied to the innermost row of solder balls when the package base is cyclically heated and cooled. Reducing the stresses applied to the solder balls increases the number of thermal cycles before solder ball fracture causes device failure. Among the means disclosed to reduce the bending moment are a bimetallic composite base, an integral stiffener, a centrally disposed cover bonded to an external structure and a package base with a stress accommodating depressed portion.

20 Claims, 3 Drawing Sheets

METAL BALL GRID ELECTRONIC PACKAGE HAVING IMPROVED SOLDER JOINT

CROSS-REFERENCE TO RELATED APPLICATION

This is a division of application Ser. No. 08/502,662, filed on Jul. 14, 1995, now abandoned, and is incorporated by reference in its entirety.

BACKGROUND OF THE INVENTION

1. Field of the Invention

This invention relates to metallic components for a ball grid array electronic package. More particularly, the bending of that component is reduced minimizing solder ball fracture due to fatigue.

2. Description of Related Art

Ball grid array electronic packages are used to house one or more integrated circuit devices, such as silicon based semiconductor chips. The packages have a base component with a plurality of metallized circuit traces. A semiconductor device is bonded to a central portion of the base component and electrically interconnected to inner ends of the circuit traces. The opposing outer ends of the circuit traces form an array. Solder balls are bonded to the points of the array. Those solder balls also bond the package to an external structure, such as a printed circuit board. A cover encapsulates the central portion of the base component, the semiconductor device and the inner ends of the circuit traces.

Typically, the base component is formed from plastic, as disclosed in U.S. Pat. No. 5,241,133 to Mullen, III et al., ceramic, or metal as disclosed in U.S. patent application Ser. No. 08/277,387 by Mahulikar et al. entitled "Integrally Bumped Electronic Package Components" that was filed on Jul. 19, 1994. Both U.S. Pat. No. 5,241,133 and U.S. patent application Ser. No. 08/277,387 are incorporated by reference in their entireties herein.

If the coefficient of thermal expansion of the electronic package base and of the external structure is different, fatigue related fracture of the solder balls may occur. Heating of the various components as a result of the semiconductor device generating heat during operation causes differential expansion of the various components to occur, resulting in stress on the solder balls. Cyclical repetition of this stress propagates cracks through the solder ball. When a crack extends across the diameter of a solder ball, the package fails.

Solder ball fatigue has been studied in plastic and ceramic base components for ball grid array packages. In a ceramic package, the stresses applied to the solder ball are parallel to the bonding plane of the base component and the solder balls in the row closest to the outer perimeter of the base fracture first. The increased distance from the center of the package to this outer row enhances the stress applied to the solder balls by thermally inducing movement of the package base.

One mechanism to reduce solder ball fatigue in a ceramic base component is disclosed in U.S. Pat. No. 4,581,680 to Garner. The Garner patent discloses that by increasing the height of the solder balls in the outer rows, the elastic limit of the solder joint is increased.

The Garner solution is inapplicable to metallic base components of ball grid array packages. With a metallic base, solder ball fracture is expected to occur in solder balls in the innermost row.

In a plastic package, the row of solder balls underlying the perimeter of the semiconductor device typically fail first.

There exists, therefore, a need to develop metal ball grid array package components that resist solder ball fatigue while retaining the thermal conductivity advantage of metal.

SUMMARY OF THE INVENTION

Accordingly, it is an object of the invention to provide a metallic ball grid array electronic package that reduces the stresses applied to solder balls and reduces solder ball fatigue and fracture.

It is a feature of the invention that the bending of the ball grid array package base is reduced by one or more of the following:

(1) forming the base with an integral stiffener;

(2) bonding a cover component to an external structure; or (3) forming a stress relieving depressed portion in the base.

An advantage of the invention is that the bending moment is reduced, reducing stresses applied to the solder balls. This reduces solder ball fatigue and solder ball fracture, thereby reducing device failure.

In accordance with the invention, there is provided a component for an electronic package. The component has a first horizontal portion and a second horizontal portion integral with the first. The first horizontal portion includes a plurality of metallized circuit traces. The second horizontal portion has a coefficient of thermal expansion less than that of the first horizontal portion.

In one embodiment of the invention, the base component has a semiconductor device bonded to a central portion and electrically interconnected to the inner ends of the metallized circuit traces. Solder balls are bonded to the outer ends of the metallized circuit traces and a cover component encapsulates the semiconductor device and the inner portion of the circuit traces. The cover is bonded to an external structure.

In another embodiment of the invention, the ball grid array package base has a peripheral portion and a central portion with a depressed portion disposed therebetween.

The above stated objects, features and advantages will become more apparent from the specification and drawings that follow.

IN THE DRAWINGS

DETAILED DESCRIPTION

Figure 1:
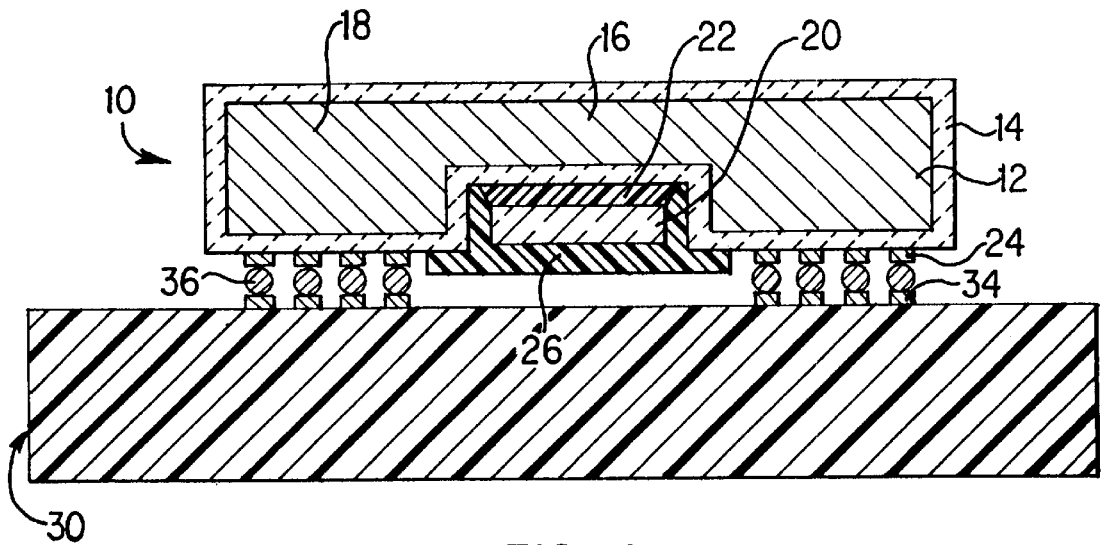
FIG. 1 illustrates in cross-sectional representation a ball grid array electronic package as known from the prior art.

FIG. 1 shows in cross-sectional representation a ball grid array electronic package 10 as known from the prior art. The package 10 has a metallic base 12 that is usually formed from copper, aluminum or an alloy thereof. Surrounding the metal base 12 is a dielectric layer 14. When the metal base 12 is an aluminum alloy, a preferred dielectric layer is an anodic film having a thickness of from about 5 microns to about 50 microns.

The metal base 12 has a central portion 16 that is preferably, as illustrated in FIG. 1, depressed and is surrounded by a peripheral portion 18. A semiconductor device 20 is bonded to the central portion 16 by a suitable die attach 22 such as a polymer adhesive.

Metallized circuit traces 24 extend from the central portion 16 to the peripheral portion 18. The semiconductor device 20 is electrically interconnected to the inner ends of the metallized circuit traces that are adjacent to the central portion 16. Electrical interconnection is by any conventional means such as wire bonds, thin strips of copper foil as utilized in tape automated bonding or by direct attachment to input/output pads on the semiconductor device such as in flip chip bonding.

A cover 26 that can be a polymer resin or an adhesively joined discrete component then encapsulates the semiconductor device 20 and the inner ends of the metallized circuit traces 24.

The package 10 is bonded to an external structure, such as a printed circuit board 30. The printed circuit board 30 has a dielectric substrate 32 formed from ceramic or a glass-filled epoxy resin. Metallized circuit traces 34 form an array pattern that aligns with the array pattern formed by the outer ends of the metallized circuit traces 24. Solder balls 36, typically a lead/tin alloy, both bond and electrically interconnect the two arrays.

When an electric signal passes through the semiconductor device 20, a portion of the electric energy is converted into heat. This heat passes into the metal base 12 and from there into the other package components, causing all components to expand by different amounts.

Figure 2:
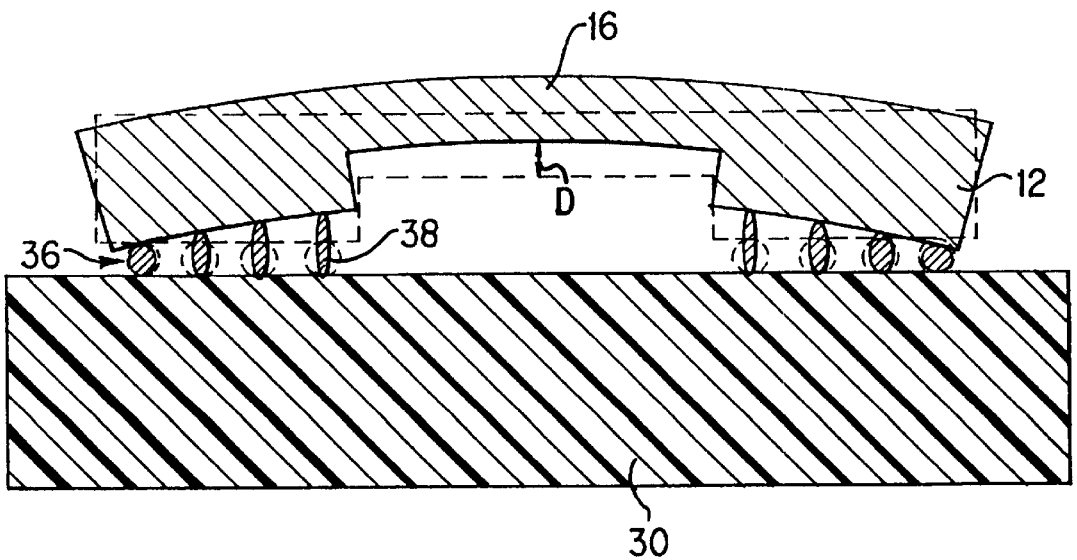
FIG. 2 illustrates in cross-sectional representation the bending of a metal ball grid array electronic package base.

FIG. 2 illustrates in cross-sectional representation alternative positioning of the metal base 12. The broken line indicates the metal base 12 at ambient (20° C.) temperature. The solid outline indicates, in exaggerated fashion, how the metal base 12 deforms when heated. Unlike plastic bases, that have a coefficient of thermal expansion about equal to that of the printed circuit board 30, the aluminum bends. The results of this distortion is that the innermost row 38 of solder balls are stretched in the Z (perpendicular to the plane of the metallized circuit traces 24) direction. Each row of solder balls 36 progressively outward from the innermost row 38 is stressed in the Z direction to a progressively less extent.

The result of the stressing of the innermost row 38 is that in a ball grid array electronic package having an aluminum alloy base, the innermost row is calculated to fail after about 2,600 thermal cycles. The outermost row will survive approximately 56,000 thermal cycles before failure. By reducing the bending, the distance "D" between the position of the central portion 16 in the two alternative configurations of FIG. 2 and the Z direction stress on the innermost row 38 of solder balls 36 are both reduced. FIGS. 3–6 illustrate electronic package structures achieving this result.

Figure 3:
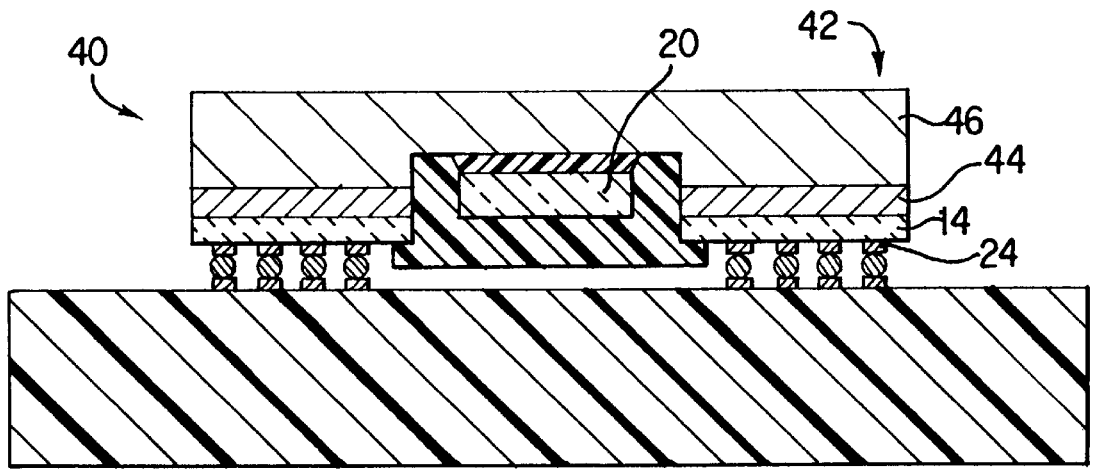
FIG. 3 illustrates in cross-sectional representation a structure to reduce the bending moment of the package base in accordance with a first embodiment of the invention.

FIG. 3 illustrates in cross-sectional representation a metal ball grid array electronic package 40 in accordance with a first embodiment of the invention. Many of the structures of the metal ball grid array package 40 are similar to those of the package 10 of FIG. 1 and are identified by like reference numerals. The base component 42 of the package 40 is a composite material having a first horizontal portion 44 and an integral second horizontal portion 46. Attachment between the first 44 and second 46 horizontal portions may be by bonding (i.e., brazing, soldering, polymer adhesive or cladding) or by chemical interaction (i.e., chemical vapor deposition or chemical conversion coating).

The metallized circuit traces 24 are formed on the first horizontal portion 44 with a dielectric layer 14 disposed therebetween. To reduce the, bending, the second horizontal portion 46 has a lower coefficient of thermal expansion at the temperature the base 42 attains by semiconductor device 20 heating during operation. Typically, this temperature is about 90° C. The bimetallic base structure bends when heated in a direction opposite to the bending direction of the base illustrated in FIG. 2.

Preferably, the second portion has a higher modulus of elasticity, is stiffer, than the first portion.

In one embodiment, the second horizontal portion 46 is copper or a copper alloy and the first horizontal portion 44 is aluminum or an aluminum alloy. The first horizontal portion 44 is relatively thin when compared to the thickness of the second horizontal portion. The ratio of the maximum thickness of the first horizontal portion 44 to the maximum thickness of the second horizontal portion 46 is from about 1:5 to 1:10 and, preferably, from about 1:6 to about 1:8. The two portions are joined together by a process such as cladding.

Alternatively, the first horizontal portion is applied by a deposition process such as plasma vapor deposition or jet vapor deposition. Typically, the second horizontal portion is copper or a copper alloy and, in this embodiment, the first horizontal portion is aluminum or a ceramic such as aluminum oxide, aluminum carbide, aluminum nitride, silicon carbide, silicon nitride or a diamond-like film. In this embodiment, the thickness of the first horizontal portion is much less than that of the second horizontal portion 46. The ratio of the thickness of the first horizontal portion 44 to thickness of the second horizontal portion 46 is from about 1:100 to 1:1000 and, preferably, from about 1:200 to about 1:400.

When the first horizontal portion 44 is a ceramic, glass or other insulative layer, it is not necessary to provide the dielectric layer 14. Also, since the ceramics and glasses are stiffer than most metals, in this embodiment, it is not necessary for the elastic modulus of the second horizontal portion 46 to be greater than that of the first horizontal portion 44.

Figure 4:
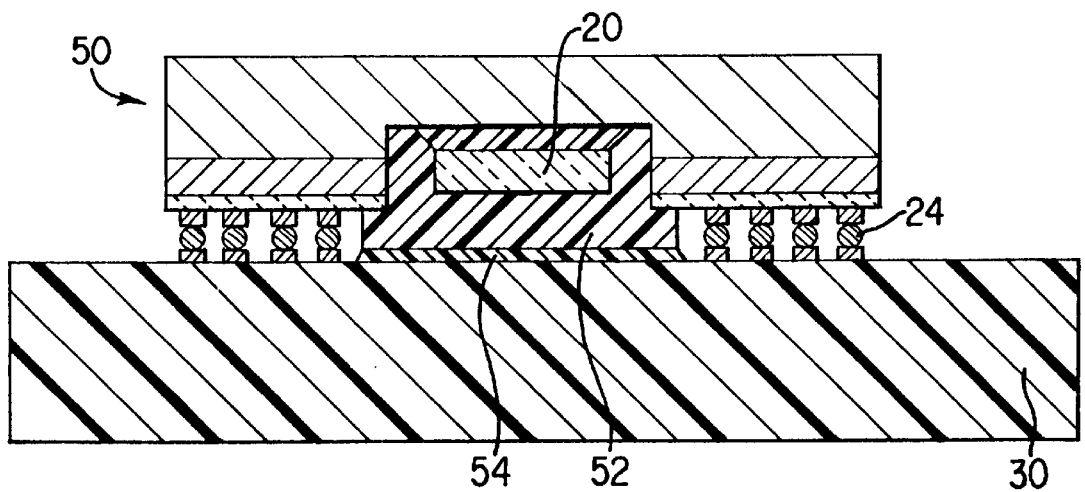
FIG. 4 illustrates in cross-sectional representation a structure to reduce the bending moment of the package base in accordance with a second embodiment of the invention.

In a second embodiment, illustrated in FIG. 4, the metal ball grid array electronic package 50 has a cover component 52 that encapsulates the semiconductor device 20 and the inner ends of the metallized circuit traces 24. To reduce the bending, the cover component 52 is bonded to an external structure such as a printed circuit board 30. Bonding of the cover component 52 to the external structure 30 is by any conventional means such as a polymer adhesive 54 or a solder or a braze.

The polymer adhesive 54, or alternative bonding means, need not extend over the entire surface area of the cover 52, but may affix the cover, only in a central portion, a peripheral portion or any combination thereof.

Figure 5:
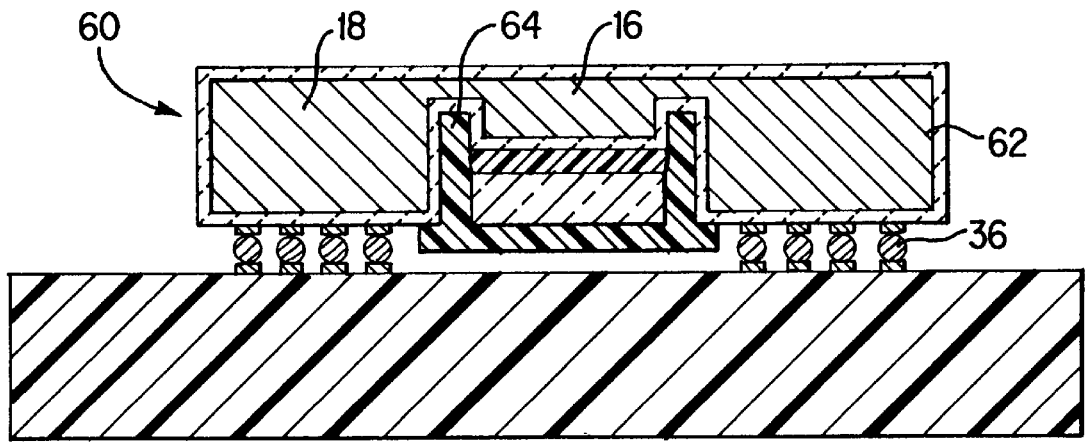
FIG. 5 illustrates in cross-sectional representation a structure to reduce the bending moment of the package base in accordance with a third embodiment of the invention.

FIG. 5 illustrates in cross-sectional representation, a third embodiment of the invention. The metallic base 62 of the metal ball grid array electronic package 60 contains a depressed portion 64 disposed between the central portion 16 and peripheral portion 18. This depressed portion 64 functions as a stress relief moat to reduce the amount of force transmitted from the center of the package to the solder balls 36. Preferably, the depressed portion 64 is filled with a molding resin and typically the filler is a portion of the cover component 66.

Alternatively, rather than a continuous moat, a series of holes or slots extending into the base about the perimeter of the central portion provides the stress relief.

A stress relieving moat for a glass sealed electronic package is disclosed in U.S. Pat. No. 5,315,155 to O'Donnelly et al. and a moat to prevent die attach adhesive from contacting the inner leads of a leadframe is disclosed in U.S. Pat. No. 5,239,131 to Hoffman et al.

Figure 6:
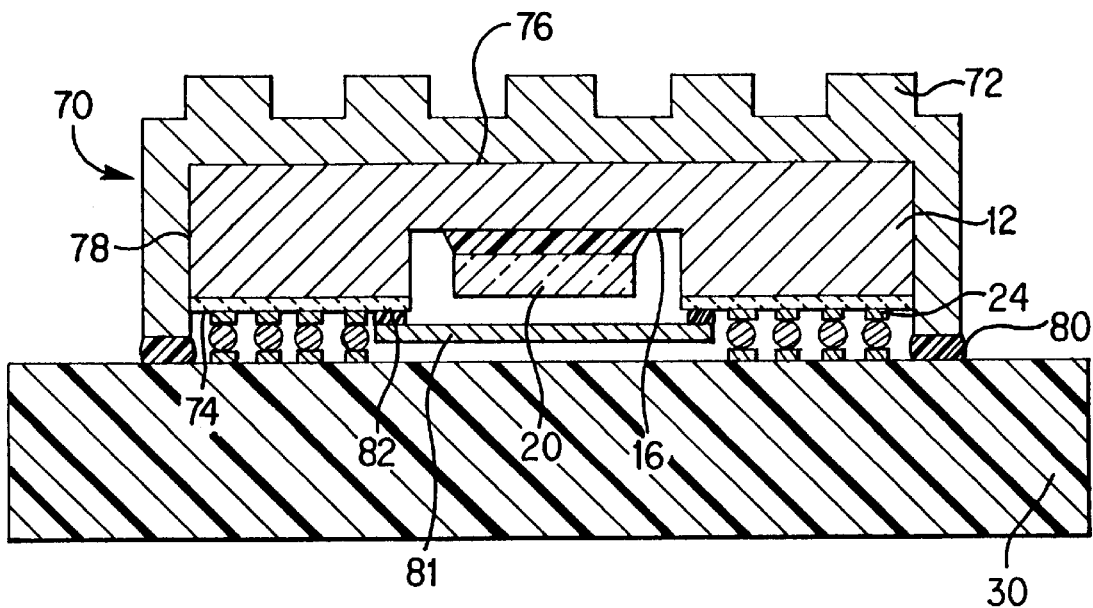
FIG. 6 illustrates in cross-sectional representation a structure to reduce the bending moment of the package base in accordance with a fourth embodiment of the invention.

In an embodiment illustrated in cross-sectional representation in FIG. 6, a metal ball grid array electronic package 70 includes a heat spreader 72. The metallic base 12 has a plurality of circuit traces 24 integral with a first side 74 thereof. One or more semiconductor devices 20 are also bonded to the first side 74. The heat spreader 72 is bonded to the opposing second side 76 of the metallic base 12. The heat spreader 72 at least covers that portion of the second side 76 opposite the central portion 16 where the semiconductor device 20 is bonded. However, the heat spreader 72 may extend over the entire opposing second side 76 and, in preferred embodiments, extends down the sidewalls 78 of the metallic base 12 and is bonded, such as by an adhesive 80, to an external structure such as the printed circuit board 30.

While the preceding embodiments disclose a plastic molding resin as the cover component, it is within the scope of the invention for any of the embodiments to include a discrete cover 81 that may be any suitable plastic, metal, ceramic, or composite or compound thereof, bonded 82 to the metallic base 12 to encapsulate the semiconductor device 20 and the inner ends of the metallized circuit traces 24.

While the invention has been described in terms of ball grid array electronic packages, it is equally applicable to other leadless electronic package such as pad grid array packages and pin grid array packages.

The benefits of the invention will become more apparent from the Example that follows. The Example is exemplary and not intended to limit the scope of the invention.

EXAMPLE

The number of thermal cycles required to cause solder ball fracture was calculated using Finite Element Modelling taking into consideration the coefficient of thermal expansion and other physical properties of the package components and of the external structure, a glass-filled epoxy printed circuit board. The yield strength and the strain-hardening characteristics of a lead/tin alloy solder were also considered. More detail on the Finite Element Modeling techniques to calculate solder ball failure in a ball grid array electronic package is found in Chapter 13 of *Ball Grid Array Technology* by John H. Lau that was published in 1995 and is incorporated by reference in its entirety herein. The four packages evaluated are as follows:

Package A—This package was similar to the metal ball grid array package 10 illustrated in FIG. 1 and has a 0.040 inch thick base formed from aluminum alloy 5086 (nominal composition, by weight, 4.0% magnesium, 0.4% manganese, 0.15% chromium and the balance aluminum). The central portion of the metallic base was in the form of a cavity having a depth of 0.028 inch. The metallic base was square and had a length and width of 0.5315 inch. The cavity forming the central portion was also a square and had a length and width of 0.2259 inch.

Disposed on the peripheral portion were four rows of solder balls extending from an innermost row, closest to the central portion and designated as row 1 to an outermost row, closest to the sidewalls of the metallic base and designated as row 4.

Package B—This package was similar to Package A except that the metallic base 12 was formed from copper rather than an aluminum alloy.

Package C—This package was similar to the metal ball grid array package 40 illustrated in FIG. 3. The first horizontal portion 44 was aluminum with a thickness of 0.005 inch and the second horizontal portion 46 was copper with a thickness of 0.035 inch. The other package dimensions were similar to Package A.

package D—This package was similar to Package A except the molded plastic cover was bonded to a glass-filled epoxy resin printed circuit board as illustrated in FIG. 4.

For each model, the packages were thermal cycled with each cycle comprising:

heating the package to 100° C. in 5 minutes;

holding the package at 100° C. for 5 minutes;

cooling the package to 0° C. in 5 minutes; and holding the package at 0° C. for 5 minutes.

The cycle was repeated and the number of cycles to predicted failure calculated from the Finite Element Model results. For each package, the following were calculated:

Characteristic life—the number of cycles required to form a crack equal to the diameter of a solder ball.

Failure-free life—one half the characteristic life.

Row reliability—an estimate of the number of cycles before a solder ball in a given row fails accounting for the number of solder balls per row.

Component reliability—the lowest of the four row reliability values.

As shown in Table 1, both Package C and Package D increased the Characteristic life of the row 1 solder balls. The most dramatic improvement was with package D.

TABLE 1

| | | Predicted Cycle to Failure | | | |
|---|---|---|---|---|---|
| Package Description | | Row 1 | Row 2 | Row 3 | Row 4 |
| Package A | Characteristic life | 2611 | 21997 | 135573 | 55881 |
| | Failure free life | 1306 | 10998 | 67786 | 27941 |
| | Row reliability | 1591 | 13275 | 81161 | 33223 |
| | Component reliability | 1591 | | | |
| Package B | Characteristic life | 3372 | 5350 | 6432 | 6695 |
| | Failure free life | 1686 | 2675 | 3216 | 3347 |
| | Row reliability | 2055 | 3229 | 3851 | 3980 |
| | Component reliability | 2055 | | | |
| Package C | Characteristic life | 4361 | 21215 | 48773 | 41757 |
| | Failure free life | 2180 | 10607 | 24386 | 20879 |
| | Row reliability | 2657 | 12803 | 29198 | 24826 |
| | Component reliability | 2657 | | | |
| Package D | Characteristic life | 45681 | 62241 | 60265 | 30738 |
| | Failure free life | 22840 | 31120 | 30133 | 15369 |
| | Row reliability | 27837 | 37563 | 36078 | 18274 |
| | Component reliability | | | | 18274 |

It is apparent that there has been provided in accordance with this invention a ball grid array electronic package having a metallic base with improved solder joint reliability that fully satisfies the objects, features and advantages set forth hereinbefore. While the invention has been described in combination with specific embodiments and examples thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A ball grid array electronic package, comprising:
a base component having a first horizontal portion integral with a second horizontal portion wherein said first horizontal portion includes a plurality of metallized circuit traces extending from a peripheral portion of said base to a central portion thereof, and said second horizontal portion has a coefficient of thermal expansion that is less than the coefficient of thermal expansion of said first horizontal portion;
a plurality of solder balls bonded to said metallized circuit traces at a peripheral portion of said base;
a semiconductor device electrically interconnected to said metallized circuit traces and bonded to a central portion of said base; and
a cover component encapsulating said semiconductor device and a portion of said circuit traces, said cover further bonded to an external structure.

2. The electronic package of claim 1 wherein the ratio of the maximum thickness of the first horizontal portion to the maximum thickness of the second horizontal portion is from about 1:5 to 1:10.

3. The electronic package of claim 2 wherein said first horizontal component is aluminum or an aluminum alloy and said second horizontal component is copper or a copper alloy.

4. The electronic package of claim 1 wherein said first horizontal portion is ceramic and said second horizontal portion is a metal or metal alloy.

5. A ball grid array electronic package, comprising:
a base component having a peripheral portion and a central portion;
a plurality of circuit traces integral with said base component each said circuit trace having a peripheral end and an inner end;
a semiconductor device bonded to said central portion of said base component and electrically interconnected to said inner ends of said circuit traces;
a plurality of solder balls bonded to said peripheral ends of said circuit traces; and
a cover encapsulating said semiconductor device and said inner ends of said circuit traces, said cover further bonded to an external structure.

6. The package of claim 5 wherein said external structure is a printed circuit board.

7. The package of claim 6 wherein said cover is a polymer molding resin.

8. The package of claim 6 wherein said cover is a discrete component selected from the group consisting of metals, polymers and ceramics.

9. The package of claim 5 wherein the base component is fabricated from a material selected from the group consisting of aluminum and copper.

10. The package of claim 5 wherein the base component is anodized aluminum.

11. A ball grid array electronic package, comprising:
a base component having a peripheral portion and a central portion with a depressed portion disposed therebetween;
a plurality of circuit traces having a peripheral and an inner end, said inner end adjacent said depressed portion;
a semiconductor device bonded to said central portion of said base component and electrically interconnected to inner ends of said circuit traces;
a plurality of solder balls bonded to said peripheral ends of said circuit traces; and
a cover component encapsulating said central portion and said depressed portion of said base and said inner ends of said circuit traces.

12. The package of claim 11 wherein said cover is a polymer resin.

13. The package of claim 11 wherein said polymer resin extends into said depressed portion.

14. A ball grid array electronic package, comprising:
a base component having a peripheral portion and a central portion;
a plurality of circuit traces integral with a first side of said base component, said circuit traces having an inner end and a peripheral end;
a semiconductor device bonded to said central portion of said base component and electrically interconnected to the inner ends of said circuit traces;
a plurality of solder balls bonded to the peripheral ends of said circuit traces;
a cover encapsulating said central portion of said base component, said semiconductor device and said inner ends of said circuit traces; and
a stiffener bonded to an opposing second side of said base component.

15. The package of claim 14 wherein said stiffener extends over the entire second side of said base component.

16. The package of claim 15 wherein said stiffener extends along the sidewalls of said base component and is bonded to an external structure.

17. The package of claim 16 wherein said cover is also bonded to said external structure.

18. The package of claim 15 wherein said stiffener is a heat spreader.

19. The package of claim 14 wherein the base component is fabricated from a material selected from the group consisting of aluminum and copper.

20. The package of claim 14 wherein the base component is anodized aluminum.

* * * * *